United States Patent
Kobayashi et al.

(10) Patent No.: US 9,985,196 B2
(45) Date of Patent: May 29, 2018

(54) MULTI-LAYERED FILM AND METHOD OF MANUFACTURING THE SAME

(71) Applicant: ULVAC, INC., Chigasaki-shi (JP)

(72) Inventors: Hiroki Kobayashi, Chigasaki (JP); Mitsunori Henmi, Chigasaki (JP); Mitsutaka Hirose, Chigasaki (JP); Kazuya Tsukagoshi, Chigasaki (JP); Isao Kimura, Chigasaki (JP); Koukou Suu, Chigasaki (JP)

(73) Assignee: ULVAC, INC., Chigasaki-Shi (JP)

( * ) Notice: Subject to any disclaimer, the term of this patent is extended or adjusted under 35 U.S.C. 154(b) by 0 days. days.

(21) Appl. No.: 15/319,617

(22) PCT Filed: Jun. 11, 2015

(86) PCT No.: PCT/JP2015/066882
§ 371 (c)(1),
(2) Date: Dec. 16, 2016

(87) PCT Pub. No.: WO2015/194452
PCT Pub. Date: Dec. 23, 2015

(65) Prior Publication Data
US 2017/0148975 A1    May 25, 2017

(30) Foreign Application Priority Data
Jun. 20, 2014 (JP) ................. 2014-127467

(51) Int. Cl.
*B32B 15/04* (2006.01)
*H01L 41/187* (2006.01)
(Continued)

(52) U.S. Cl.
CPC .......... *H01L 41/1876* (2013.01); *C01G 25/02* (2013.01); *C01G 53/04* (2013.01);
(Continued)

(58) Field of Classification Search
USPC ................................... 428/426, 688
See application file for complete search history.

(56) References Cited

U.S. PATENT DOCUMENTS 6,555,886 B1 * 4/2003 Xu .................. H01L 41/1876
257/295
8,956,689 B2 * 2/2015 Watanabe ......... H01L 21/02197
427/100
(Continued)

FOREIGN PATENT DOCUMENTS

EP    2306539    4/2011
EP    2626442    8/2013
(Continued)

OTHER PUBLICATIONS

Espacenet translation of JP2011029399.*
(Continued)

*Primary Examiner* — Lauren R Colgan
(74) *Attorney, Agent, or Firm* — Grossman, Tucker, Perreault & Pfleger, PLLC (57) ABSTRACT

A multi-layered film includes an electroconductive layer made of platinum (Pt), a seed layer including lanthanum (La), nickel (Ni), and oxygen (O), and a dielectric layer being preferentially oriented in a c-axis direction, which are at least sequentially disposed on a main surface of a substrate made of silicon.

5 Claims, 8 Drawing Sheets

(51) Int. Cl.
*C01G 25/02* (2006.01)
*C01G 53/04* (2006.01)
*C23C 14/14* (2006.01)
*C23C 14/08* (2006.01)
*H01L 41/047* (2006.01)
*H01L 41/319* (2013.01)
*H01L 41/316* (2013.01)

(52) U.S. Cl.
CPC .............. *C23C 14/08* (2013.01); *C23C 14/14* (2013.01); *H01L 41/0477* (2013.01); *H01L 41/316* (2013.01); *H01L 41/319* (2013.01)

(56) References Cited

U.S. PATENT DOCUMENTS

| | | | |
|---|---|---|---|
| 2003/0106489 A1* | 6/2003 | Lung | C30B 23/02 117/84 |
| 2007/0007860 A1* | 1/2007 | Takabe | B41J 2/14233 310/324 |
| 2007/0046152 A1* | 3/2007 | Ifuku | B41J 2/14233 310/358 |
| 2010/0096666 A1* | 4/2010 | Ishida | H01G 4/1245 257/190 |
| 2010/0289383 A1 | 11/2010 | Harigai et al. | |
| 2011/0101828 A1* | 5/2011 | Noda | H01L 41/0478 310/348 |
| 2013/0328451 A1* | 12/2013 | Kubo | H01L 41/081 310/348 |
| 2014/0159549 A1* | 6/2014 | Kubo | H01L 41/0478 310/363 |
| 2015/0077474 A1* | 3/2015 | Mawatari | H01L 41/0973 347/68 |

FOREIGN PATENT DOCUMENTS

| | | | |
|---|---|---|---|
| JP | 2003-081694 | | 3/2003 |
| JP | 2006-100622 | | 4/2006 |
| JP | 2007-327106 | | 12/2007 |
| JP | 2008-042069 | | 2/2008 |
| JP | 2008-251916 | | 10/2008 |
| JP | 2010-084180 | | 4/2010 |
| JP | 2011-029591 | | 2/2011 |
| JP | 2011029399 | * | 2/2011 |
| JP | 2012-169400 | | 9/2012 |
| JP | 2013-098508 | | 5/2013 |
| JP | 2013-102024 | | 5/2013 |
| WO | 2012/046705 | | 4/2012 |
| WO | 2013/021614 | | 2/2013 |
| WO | 2014/024696 | | 2/2014 |

OTHER PUBLICATIONS

JPlat translation of JP2011029399.*
International Search Report from corresponding PCT Application No. PCT/JP2015/066882 dated Sep. 8, 2015. English translation attached.
Extended European Search Report from related EPO Appln. No. 15810178.2, dated Dec. 11, 2017.
Office Action from related Japanese Appln. No. 2016-529292, dated Jan. 9, 2018. English translation attached.

* cited by examiner

MULTI-LAYERED FILM AND METHOD OF MANUFACTURING THE SAME

TECHNICAL FIELD

The present invention relates to a multi-layered film that exhibits excellent piezoelectric characteristics and a method of manufacturing the multi-layered film.

This application claims priority from Japanese Patent Application No. 2014-127467 filed on Jun. 20, 2014, the contents of which are incorporated herein by reference in their entirety.

BACKGROUND ART

Currently, a piezo element using a ferroelectric material such as lead zirconate titanate (Pb (Zr, Ti)O$_3$: PZT) is applied to an MEMS (Micro Electro Mechanical Systems) technique such as an inkjet head an acceleration sensor.

Particularly, a PZT film has been attracted attention and actively researched by various organizations (Patent Document 1 to 3).

Various research has been conducted in order to improve withstand voltage characteristics of a PZT film.

Particularly, attention has been particularly focused on oriented surfaces of PZT films, manufactured PZT films having various oriented surfaces, and the relationship between the oriented surface and the piezoelectric characteristics (Patent Document 4).

Figure 11:
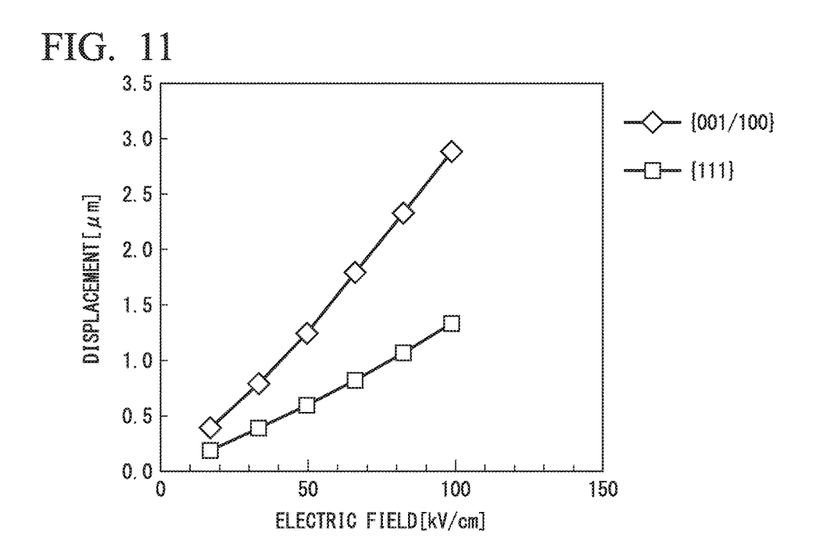
FIG. 11 is a chart showing the piezoelectric characteristics of a PZT thin film having the (100)/(001) orientation and a PZT thin film having the (111) orientation.

FIG. 11 is a chart showing the piezoelectric characteristics of a PZT film having the (100)/(001) orientation and a PZT film having the (111) orientation.

It is known from FIG. 11 that a PZT thin film having the (100)/(001) orientation exhibits more excellent piezoelectric characteristics than a PZT thin film having a (111) orientation.

Figure 12:
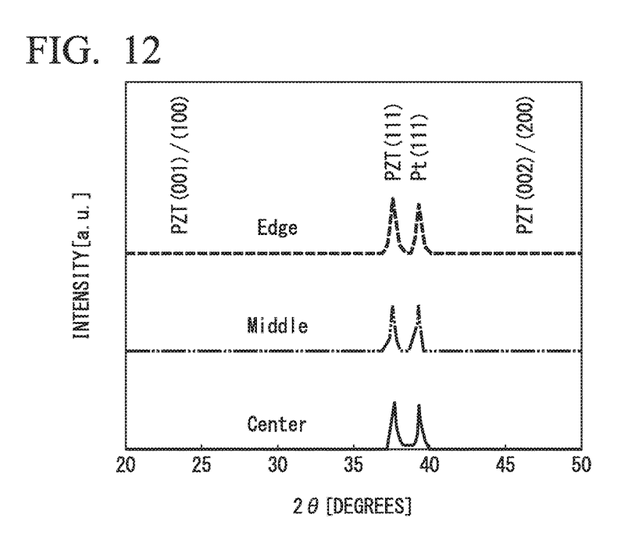
FIG. 12 is a chart showing an X-ray diffraction pattern of a conventional PZT thin film.

However, according to a conventional manufacturing method, the PZT film that exhibits X-ray charts shown in FIG. 12 is easily obtained.

FIG. 12 shows X-ray charts obtained at the three points of the PZT film formed on the Pt film which are the center portion (Center), the outer-edge portion (Edge), and the intermediate portion (Middle) between the center portion and the outer-edge portion.

It is found from FIG. 12 that the resultant PZT film is preferentially oriented in the a-axis (111) direction.

That is, conventionally, it is difficult to stably form a dielectric film that is preferentially oriented in the c-axis (001) direction, and the development of the manufacturing method thereof has been expected.

PRIOR ART DOCUMENTS

Patent Documents

[Patent Document 1] Japanese Unexamined Patent Application, First Publication No. 2007-327106
[Patent Document 2] Japanese Unexamined Patent Application, First Publication No. 2010-084180
[Patent Document 3] Japanese Unexamined Patent Application, First Publication No. 2003-081694
[Patent Document 4] PCT International Publication No. WO2012/046705

SUMMARY OF INVENTION

Problems to be Solved by the Invention

The invention was made in view of the above-described conventional situations, and has a first object to provide a multi-layered film that exhibits excellent piezoelectric characteristics.

Furthermore, the invention has a second object to provide a method of manufacturing a multi-layered film that exhibits excellent piezoelectric characteristics.

Means for Solving the Problems

According to a first aspect of the invention, a multi-layered film includes an electroconductive layer made of platinum (Pt), a seed layer including lanthanum (La), nickel (Ni), and oxygen (O), and a dielectric layer being preferentially oriented in the c-axis direction, which are at least sequentially disposed on a main surface of a substrate made of silicon.

In the above-described multi-layered film of the first aspect, according to a second aspect of the invention, the dielectric layer may include lead (Pb), zirconia (Zr), titanium (Ti), and oxygen (O).

In the above-described multi-layered film of the first aspect, according to a third aspect of the invention, the dielectric layer may be made of Pb $(Zr_xTi_{1-x})O_3$, and $0.2 \leq x \leq 0.52$.

In the above-described multi-layered film of any one of the first to the third aspects, according to a fourth aspect of the invention, a thickness of the dielectric layer may be 0.1 to 5 µm.

According to a fifth aspect of the invention, a method of manufacturing a multi-layered film, includes: forming an electroconductive layer (step A); forming a seed layer so as to coat the electroconductive layer (step B); forming a dielectric layer so as to coat the seed layer (step C); and controlling a temperature so as to apply a compression stress to the dielectric layer in a cooling process after the dielectric layer is formed.

Effects of the Invention

In the multi-layered film according to each aspect described above, an electroconductive layer made of platinum (Pt), a seed layer including lanthanum (La), nickel (Ni), and oxygen (O), and a dielectric layer are at least sequentially disposed on a main surface of a substrate made of silicon, and the dielectric layer that is disposed on the seed layer is preferentially oriented in the c-axis direction.

Consequently, a multi-layered film that exhibits excellent piezoelectric characteristics is obtained.

Moreover, In the method of manufacturing a multi-layered film according to each aspect described above, a temperature is controlled so that a compression stress is applied to the dielectric layer in the cooling process after a film is formed in the step of forming the dielectric layer, and therefore it is possible to stably form a dielectric layer that is preferentially oriented in the c-axis.

Accordingly, it is possible to provide a method of manufacturing a multi-layered film which exhibits excellent piezoelectric characteristics.

EMBODIMENTS FOR CARRYING OUT THE INVENTION

Hereinafter, a multi-layered film and a method of manufacturing the multi-layered film according to one embodiment of the invention will be described with reference to drawings.

Figure 1:
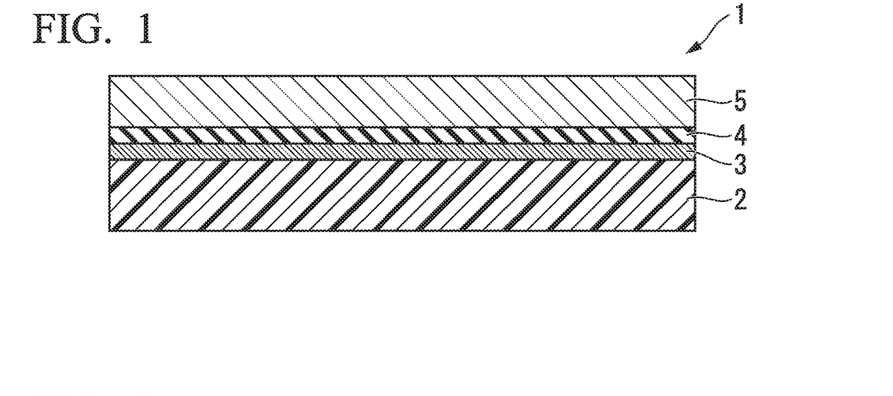
FIG. 1 is a cross-sectional view showing one configuration example of a multi-layered film according to one embodiment of the invention.

FIG. 1 is a cross-sectional view showing one configuration example of a multi-layered film according to the embodiment.

In a multi-layered film 1, an electroconductive layer 3 made of platinum (Pt), a seed layer 4 including lanthanum (La), nickel (Ni), and oxygen (O), and a dielectric layer 5 are at least disposed on the main surface of a substrate 2 made of silicon in order.

By employing the manufacturing method described below, the dielectric layer 5 that constitutes the multi-layered film 1 according to the embodiment is preferentially oriented in the c-axis (001) direction.

Since the dielectric film is preferentially oriented in the c-axis, the multi-layered film 1 that exhibits excellent piezoelectric characteristics is obtained.

The above-described multi-layered film 1 is preferably used in, for example, a piezo element or the like.

As the seed layer 4, an oxide film including lanthanum (La), nickel (Ni), and oxygen (O) is adopted.

As such oxide, specifically, for example, $LaNiO_3$ (LNO) is used.

LNO has a high degree of self-compatibility on (002) surface, and it is possible to form the film thereof at, for example, 300° C.

Moreover, LNO has a low resistance.

As described later, by using LNO as the seed layer 4, it is possible to form the film that is preferentially oriented in the c-axis when forming the dielectric layer 5.

In order to orient the dielectric layer 5 in the c-axis, it is preferable that the LNO serving as a seed layer have a compression stress.

The dielectric layer 5 is not particularly limited and is made of a ferroelectric material such as lead zirconate titanate (Pb $(Zr_xTi_{1-x})O_3$: PZT), $PbTiO_3$, $BaTiO_3$, PMM-PZT, PNN-PZT, PMN-PZT, PNN-PT, PLZT, PZTN, NBT, or KNN.

Among others, particularly, for example, lead zirconate titanate (Pb $(Zr_xTi_{1-x})O_3$: PZT) including lead (Pb), zirconia (Zr), titanium (Ti), and oxygen (O) is preferred as the dielectric layer 5.

Figure 2:
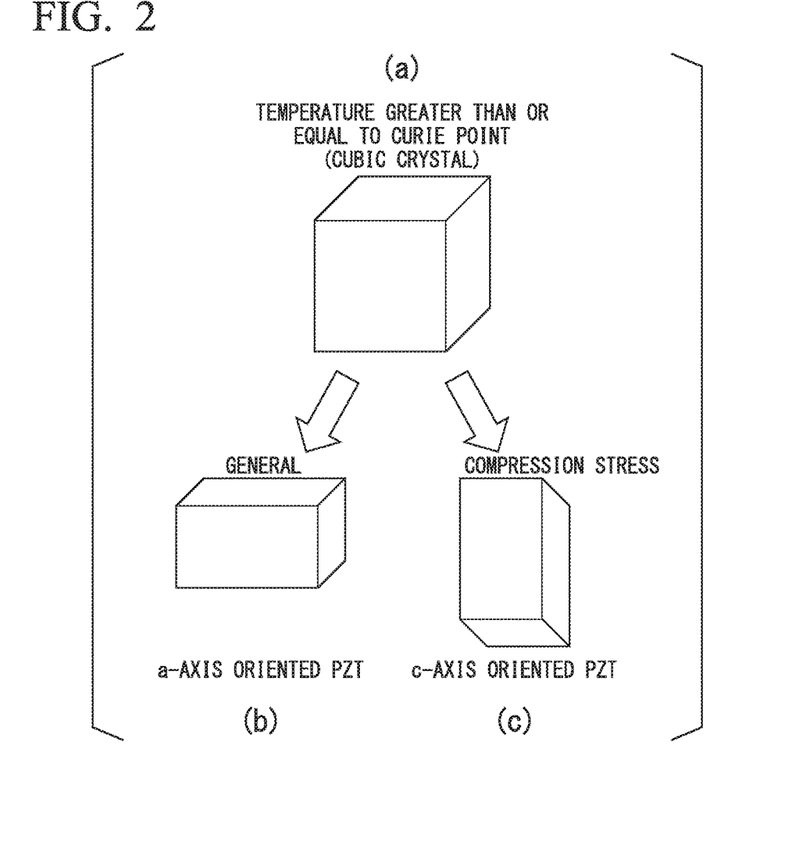
FIG. 2 is a diagram schematically showing a change of the crystal structure of PZT from a from formation process to a cooling process.

FIG. 2 is a diagram schematically showing a change of the crystal structure of PZT from a from formation process to a cooling process.

The crystal structure of the PZT is a cubic crystal (Cubic) (FIG. 2(a)); however, after film formation is carried out at a high temperature (for example, at a temperature greater than or equal to Curie point), the crystal structure is changed to a tetragonal crystal (Tetra) in the cooling process.

At this time, in a general case, the PZT film is oriented in the a-axis (FIG. 2(b)); however, if a compression stress is applied to the PZT in the cooling process, the PZT is oriented in the c-axis (FIG. 2(c)).

As a result of using LNO as the seed layer 4, it is possible to form the PZT film that is preferentially oriented in the c-axis when the PZT film serving as the dielectric layer 5 is formed on the seed layer 4.

The reason is believed to be that $LaNiO_3$ has the coefficient of thermal expansion greater than that of the PZT.

That is, it is thought that since the PZT film receives a compression stress in the cooling process after the PZT film is formed, the PZT film is preferentially oriented in the c-axis.

Here, in the case where the composition of the PZT is represented by Pb$(Zr_xTi_{1-x})O_3$, it is preferable that $0.2 \leq x \leq 0.52$.

By determining the composition to be in the range ($0.2 \leq x \leq 0.52$), it is possible to orient the PZT in the C axis.

Furthermore, it is preferable that a thickness of the dielectric layer 5 be 0.1 to 5 μm.

In the case where the thickness of the dielectric layer 5 is less than 0.1 μm, sufficient piezoelectric characteristics are not obtained.

On the other hand, in the case where the thickness of the dielectric layer 5 is greater than 5 μm, it is undesirable in consideration of throughput.

By determining the thickness of the dielectric layer 5 to be 0.1 to 5 μm, it is possible to obtain the throughput that can realize mass production and a PZT film that exhibits excellent piezoelectricity.

Next, a method of manufacturing the multi-layered film according to the embodiment will be described.

In the following explanation, as an example, the case will be described where lead zirconate titanate (Pb $(Zr_xTi_{1-x})O_3$: PZT) is used as the dielectric layer 5; however, the invention is not limited to this.

(Film Formation Apparatus)

Hereinbelow, the configuration of a preferred film formation apparatus in order to carry out the method of manufacturing a multi-layered film according to the embodiment will be described.

Figure 3:
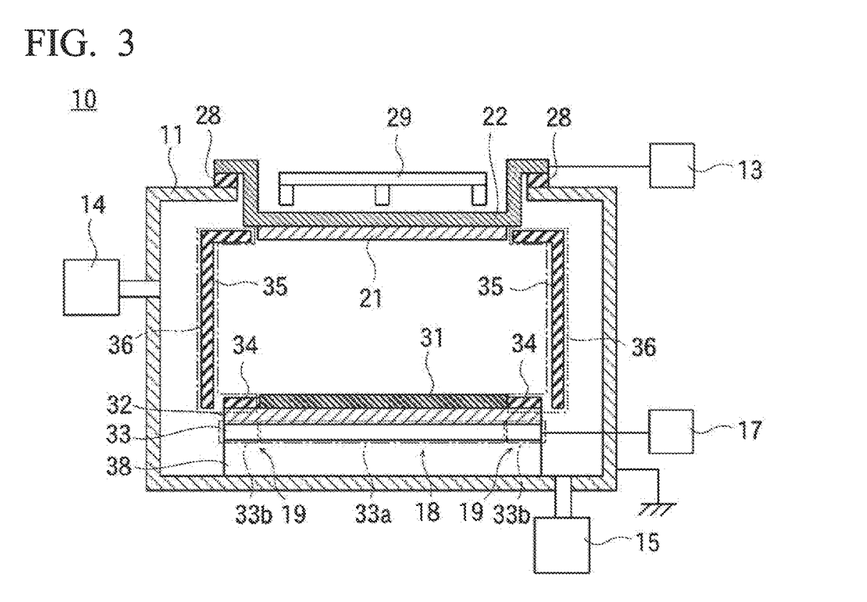
FIG. 3 is a view schematically showing an internal constitution of a film formation apparatus used in the embodiment.

FIG. 3 is a schematic cross-sectional view showing an example of the internal constitution of a film formation apparatus 10.

The film formation apparatus 10 includes: a vacuum chamber 11; a target 21; a support (substrate holding stage) 32; a temperature controller 18; a sputtering power source 13; a sputtering gas introduction unit 14; a first adhesion-preventing plate 34; and a second adhesion-preventing plate 35.

The target 21 is disposed in the vacuum chamber 11.

The support 32 is disposed at the position facing to the target 21 and is configured to hold a substrate 31 (substrate 2).

The temperature controller 18 controls a substrate temperature by heating or cooling the substrate 31 supported by the support 32.

The sputtering power source 13 is configured to apply a voltage to the target 21.

The sputtering gas introduction unit 14 is configured to introduce a sputtering gas into the vacuum chamber 11.

The first adhesion-preventing plate 34 and the second adhesion-preventing plate 35 are disposed in the vacuum chamber 11 at the positions to which particles emitted from the target 21 are attached.

A cathode electrode 22 is disposed at the upper wall surface of the vacuum chamber 11 with an insulating member 28 interposed therebetween, and the cathode electrode 22 is electrically insulated from the vacuum chamber 11.

The vacuum chamber 11 has a ground potential.

One of the surfaces of the cathode electrode 22 is locally exposed to the inside of the vacuum chamber 11.

The target 21 is brought into close contact with and fixed to the center portion of the exposed region of the surface of the cathode electrode 22, and the target 21 is electrically connected to the cathode electrode 22.

The sputtering power source 13 is disposed outside the vacuum chamber 11.

The sputtering power source 13 is electrically connected to the cathode electrode 22 and is capable of applying an alternating voltage to the target 21 through the cathode electrode 22.

A magnet device 29 is disposed on the cathode electrode 22 on the opposite side of the target 21, that is, on the other side of the cathode electrode 22.

The magnet device 29 is configured to form magnetic field lines on the surface of the target 21.

The support 32 on which the substrate 31 is to be mounted is made of, for example, carburization silicon (SiC).

The outer-periphery of the support 32 is formed larger than the outer-periphery of the substrate 31.

The surface of the support 32 is arranged so as to face the surface of the target 21.

The means which electrostatically attracts the substrate 31 is located inside the support 32.

When the substrate 31 is electrostatically attracted to the center region of the surface of the support 32, the back surface of the substrate 31 is brought into close contact with the center region of the surface of the support 32, and the substrate 31 is thermally connected to the support 32.

The first adhesion-preventing plate 34 is made of quartz or ceramics such as alumina.

The first adhesion-preventing plate 34 is formed in an annular shape such that the inner-periphery of the first adhesion-preventing plate 34 is larger than the outer-periphery of the substrate 31 and such that the first adhesion-preventing plate is arranged so as to cover the outer-edge portion which is located outside of the center region of the surface of the support 32.

Consequently, the particles discharged from the target 21 are prevented from being adhered to the outer-edge portion of the surface of the support 32.

The back surface of the first adhesion-preventing plate 34 is brought into close contact with the outer-edge portion of the surface of the support 32, and the first adhesion-preventing plate 34 is thermally connected to the support 32.

When the substrate 31 is mounted on the center region of the surface of the support 32, the first adhesion-preventing plate 34 is arranged so as to surround the outer side of the outer-periphery of the substrate 31.

The second adhesion-preventing plate 35 is made of quartz or ceramics such as alumina.

The second adhesion-preventing plate 35 is formed in a cylindrical shape such that the inner-periphery of the second adhesion-preventing plate 35 is larger than the outer-periphery of the target 21 or the outer-periphery of the substrate 31.

The second adhesion-preventing plate 35 is arranged between the support 32 and the cathode electrode 22 and is configured to surround the side region of the space between the substrate 31 and the target 21.

For this reason, the particles discharged from the target 21 are prevented from being adhered to the wall surface of the vacuum chamber 11.

The temperature controller 18 includes a heat generation member 33 and a heating power source 17.

As a material used to form the heat generation member 33, SiC is used.

The heat generation member 33 is placed at the position on the opposite side of the substrate 31 with the support 32 interposed therebetween.

The heating power source 17 is electrically connected to the heat generation member 33.

When a direct current is supplied to the heat generation member 33 from the heating power source 17, the heat generated from the heat generation member 33 is transmitted through the support 32 to the substrate 31 mounted on the support 32 and the first adhesion-preventing plate 34, and the substrate 31 and the first adhesion-preventing plate 34 are thereby heated together.

The back surface of the substrate 31 is in close contact with the center region of the surface of the support 32, the heat is uniformly transferred to the center portion of the substrate 31 and the outer-edge portion.

A cooling unit 38 is disposed on the heat generation member 33 on the opposite side of the support 32.

The cooling unit 38 is configured to be able to circulate a temperature-controlled cooling medium in the internal side thereof and prevents the wall surface of the vacuum chamber 11 from being heated even where heat is generated from the heat generation member 33.

The sputtering gas introduction unit 14 is connected to the inside of the vacuum chamber 11 and is configured to be able to introduce a sputtering gas into the inside of the vacuum chamber 11.

(Method of Forming Multi-Layered Film)

Hereinbelow, a method of forming a multi-layered film will be described.

FIG. 3 is a view schematically showing an internal constitution of a film formation apparatus used to manufacture a multi-layered film.

Figure 4A:
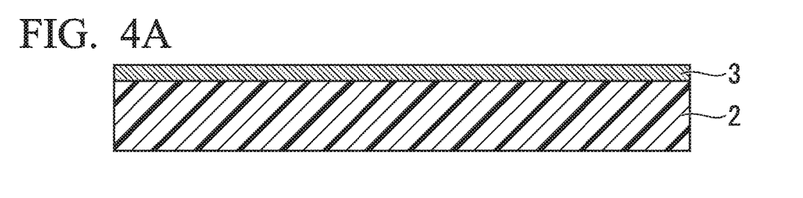
FIG. 4A is a cross-sectional view showing a process of manufacturing the multi-layered film according to the embodiment.
Figure 4B:
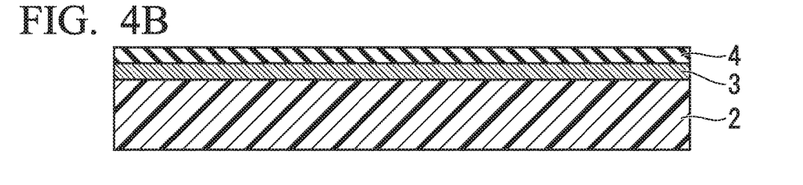
FIG. 4B is a cross-sectional view showing a process of manufacturing the multi-layered film according to the embodiment.
Figure 4C:
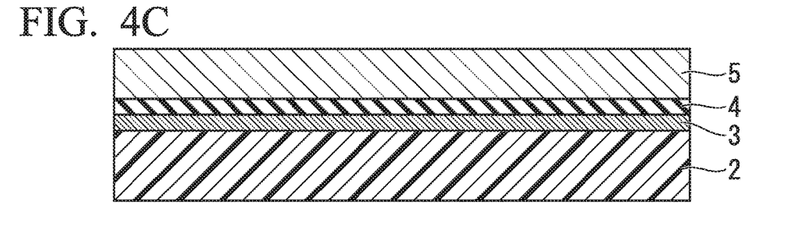
FIG. 4C is a cross-sectional view showing a process of manufacturing the multi-layered film according to the embodiment.

FIGS. 4A to 4C are cross-sectional views showing steps of manufacturing the multi-layered film according to the embodiment.

FIG. 3 shows an example of the case where the film formation apparatus 10 includes one vacuum chamber 11 in order to simplify the explanation thereof; however, in the manufacturing method including the steps A to C which will be described below, the case is explained where the film formation apparatus that is configured to include at least three vacuum chambers 11a, 11b, and 11c (11) is used. The vacuum chambers are communicated with each other via an isolation valve which is not shown in the figure in the paperface depth direction in FIG. 3.

Here, the vacuum chamber 11a (11) is a vacuum chamber that is used to form an electroconductive layer.

The vacuum chamber 11b (11) is a vacuum chamber that is used to form a seed layer.

The vacuum chamber 11c (11) is a vacuum chamber that is used to form a dielectric layer.

In the following explanation, the vacuum chambers are discriminated by reference numerals, and members associated with each vacuum chamber are not discriminated by reference numerals.

(Step A): Formation of Electroconductive Layer

In the step A, as shown in FIG. 4A, the electroconductive layer 3 made of platinum (Pt) is formed on a main surface of the substrate 2 made of silicon (Si).

Hereinbelow, the case of directly forming an electroconductive layer on the main surface side of the substrate will be described; however, if required, before forming the electroconductive layer, the other film may be provided on the main surface side of the substrate 2.

The pressure of the internal space of the vacuum chamber 11a (11) in which a target serving as the target 21a (21) and made of Pt is disposed is reduced by use of a vacuum pump 15.

Consequently, the internal space of the vacuum chamber 11a (11) is in a state of having a high degree of vacuum that is higher than the degree of vacuum atmosphere in which a film is formed.

After that, the vacuum pumping is continuously carried out and the vacuum atmosphere in the vacuum chamber 11 is thereby maintained.

While maintaining the vacuum atmosphere in the vacuum chamber 11, the substrate 31 on which a film is to be formed in the internal space of the vacuum chamber 11a (11) is transferred thereto through an inlet which is not shown in the figure.

Subsequently, the substrate 31 is held on the center region of the support 32 so that the main surface side of the substrate 31 faces the sputtering surface of the target 21.

The temperature-controlled cooling medium circulates in the cooling unit 38 in advance.

Next, in a step of forming an electroconductive layer, while the substrate 31 is maintained in a film deposition temperature, an Ar gas serving as a sputtering gas is introduced into the inside of the vacuum chamber 11 from the sputtering gas introduction unit 14, an alternating voltage is applied from the sputtering power source 13 to the cathode electrode 22, and Pt target is thereby sputtered.

Consequently, the Pt electroconductive layer 3 is formed on the main surface side of the substrate 31.

(Step B): Formation of Seed Layer

In the step B, as shown in FIG. 4B, the seed layer 4 is formed so as to coat the electroconductive layer 3.

An oxidative product including lanthanum (La), nickel (Ni), and oxygen (O) is formed as the seed layer 4.

An LNO target that is made of an oxidative product including La, Ni, and O and serves as the target 21 is disposed in the vacuum chamber 11b (11), the pressure of the internal space of the vacuum chamber is previously reduced by the vacuum pump 15, and in advance, the internal space of the vacuum chamber is in a vacuum state of having a high degree of vacuum that is higher than the degree of vacuum atmosphere in which a film is formed.

While maintaining the vacuum atmosphere in the vacuum chamber 11b (11), the substrate 31 on which the Pt electroconductive layer 3 is provided in advance is transferred from the vacuum chamber 11a (11) to the internal space of the vacuum chamber 11b (11).

Subsequently, the substrate 31 is held on the center region of the surface of the support 32 so that the main surface of the substrate 31, that is, the Pt electroconductive layer 3 faces the sputtering surface of the LNO target 21.

After that, while maintaining the substrate 31 at a film deposition temperature, Ar gas and oxygen gas serving as a sputtering gas are introduced into the inside of the vacuum chamber 11b (11) from the sputtering gas introduction unit 14, and the LNO target is sputtered by applying an alternating voltage to the cathode electrode 22 from the sputtering power source 13.

Consequently, the seed layer 4 made of LNO is formed on the Pt electroconductive layer 3 located on the main surface side of the substrate 31.

Particularly, in the case of forming the seed layer 4, the substrate temperature in the film formation time is controlled based on a predetermined temperature profile as necessary.

A constant temperature may be maintained from the start of film formation to completion of the film formation.

For example, the temperature at the start of film formation may be determined to be higher than that of the completion of the film formation.

(Step C): Formation of Dielectric Layer

In the step C, as shown in FIG. 4C, the dielectric layer 5 is formed so as to coat the seed layer 4.

A PZT film serving as the dielectric layer 5 is formed by a sputtering method.

A PZT target serving as the target 21 is disposed in the vacuum chamber 11c (11), the pressure of the internal space of the vacuum chamber is reduced by the vacuum pump 15, and the internal space of the vacuum chamber is thereby in a vacuum state of having a high degree of vacuum that is higher than the degree of vacuum atmosphere in which a film is formed.

While maintaining the vacuum atmosphere in the vacuum chamber 11c (11), the substrate 31 on which the Pt electroconductive layer 3 and the seed layer 4 are provided in advance is transferred from the vacuum chamber 11b (11) to the internal space of the vacuum chamber 11c (11).

Subsequently, the substrate 31 is held on the center region of the surface of the support 32 so that the main surface of the substrate 31, that is, the seed layer 4 faces the sputtering surface of the PZT target 21.

After that, while maintaining the substrate 31 at a film deposition temperature, Ar gas and oxygen gas serving as a sputtering gas are introduced into the inside of the vacuum chamber 11b (11) from the sputtering gas introduction unit 14, and the PZT target is sputtered by applying an alternating voltage to the cathode electrode 22 from the sputtering power source 13.

Accordingly, the dielectric layer 5 formed of the PZT film having the perovskite structure is formed on the seed layer 4 located on the main surface side of the substrate 31.

Particularly, in the case of forming the dielectric layer 5, the substrate temperature in the film formation time is controlled based on a predetermined temperature profile as necessary.

A constant temperature may be maintained from the start of film formation to completion of the film formation.

For example, the temperature at the start of film formation may be determined to be higher than that of the completion of the film formation.

After the PZT thin film having a predetermined film thickness is formed on the substrate 31, the application of voltage from the sputtering power source 13 to the cathode electrode 22 is stopped, and the introduction of the sputtering gas from the sputtering gas introduction unit 14 into the inside of the vacuum chamber 11c (11) is stopped.

The supply of the electrical current from the heating power source 17 to the heat generation member 33 is stopped, the heat generation member 33 is cooled down, and the temperature of the substrate 31 becomes lower than the film deposition temperature.

For example, in the vacuum chamber 11c (11), the temperature of the heat generation member 33 is reduced to be lower than or equal to 400° C., and the temperature is maintained.

Here, LNO has the coefficient of thermal expansion greater than that of the PZT.

Accordingly, in the cooling process, the dielectric layer 5 made of the PZT film which is formed on the seed layer 4 made of a LNO film receives a compression stress.

As a result, in the cooling process, the PZT film is preferentially oriented in the c-axis.

As stated above, the dielectric layer 5 is preferentially oriented in the c-axis by providing the LNO film as the seed layer 4.

While maintaining the vacuum atmosphere in the vacuum chamber 11, the film-formed substrate 31 on which the multi-layered film is formed by stacking the three layers (the electroconductive layer, the seed layer, and the dielectric layer) in order is discharged to the outside of the vacuum chamber 11 through an outlet which is not shown in the figure.

Particularly, a transfer robot which is not shown in the figure is preferably used to transfer the aforementioned substrate, that is, transfer the substrate from the outside to the vacuum chamber 11a (11), transfer the substrate between the vacuum chambers, transfer the substrate from the vacuum chamber 11c (11) to the outside.

In the above manner, the multi-layered film 1 having the structure shown in FIG. 1 is manufactured.

In the multi-layered film 1, the dielectric layer 5 is preferentially oriented in the c-axis.

Accordingly, the multi-layered film 1 exhibits, for example, both excellent fatigue characteristics and excellent piezoelectric characteristics, and has excellent characteristics.

The foregoing multi-layered film 1 is preferably used in, for example, a piezo element or the like.

EXPERIMENTAL EXAMPLE

Hereinbelow, examples of experiment will be described which are carried out in order to check the effect of the above-described invention.

PZT films (dielectric layer) are formed with or without a seed layer, and the characteristics thereof are evaluated.

Experimental Example 1

In this example, a multi-layered film was formed by stacking an electroconductive layer formed of a Pt film, a seed layer formed of a $LaNiO_3$ film, and a dielectric layer formed of a PZT film in order.

As the substrate, a silicon (Si) wafer having a diameter of eight inches was used.

Here, a Si wafer was used which has a main surface side on which a thermal oxidation film ($SiO_2$ film), a Ti film functioning as an adhesion layer (thickness of 20 nm), and a Pt film functioning as a lower electrode layer (thickness of 100 nm) are layered in order in advance.

As a sputtering apparatus, a flat-plate magnetron sputtering apparatus (SME-200) having the configuration shown in FIG. 2 was used.

As a sputtering power source, a high-frequency power source (frequency of 13.56 MHz) was used.

The conditions of forming the seed layer formed of the $LaNiO_3$ film were determined as follows.

As a target, a $LaNiO_3$ target having a diameter of 300 mm and a thickness of 5 mm was used.

A sputtering power was 1.0 (kW), a sputtering pressure was 0.4 (Pa), and a substrate temperature was 320° C.

The film thickness of the seed layer was 100 (nm).

The conditions of forming the dielectric layer formed of the PZT film were determined as follows.

As a target, a PZT target having a diameter of 300 mm and a thickness of 5 mm was used.

A sputtering power was 2.5 (kW), a sputtering pressure was 0.5 (Pa), and a substrate temperature was 505° C.

The film thickness of the dielectric layer was 2.0 ($\mu$m).

The sample of the experimental example 1 which is manufactured under the aforementioned conditions was referred to as Sample 1.

Experimental Example 2

In this example, a multi-layered film was formed by forming a PZT film on a Pt thin film on a substrate without providing a seed layer.

A PZT film is formed under the substrate temperature condition of 585° C.

The conditions of forming the films other than the dielectric layer formed of the PZT film are the same as that of the experimental example 1.

The sample of the experimental example 2 which is manufactured under the aforementioned conditions was referred to as Sample 2.

Experimental Example 3

A PZT film was formed on a Pt thin film of a Si substrate without forming a seed layer at a substrate temperature of 585° C., and thereafter annealing treatment was carried out under the conditions of "700° C., for 15 minutes".

The conditions of forming the films other than the dielectric layer formed of the PZT film are the same as that of the aforementioned Sample 1.

The sample of the experimental example 3 which is manufactured under the aforementioned conditions was referred to as Sample 3.

The crystal structures of the PZT films of Samples 1 and 2 which are manufactured in the experimental examples 1 and 2, respectively, were analyzed by use of an X-ray diffraction method.

Figure 5:
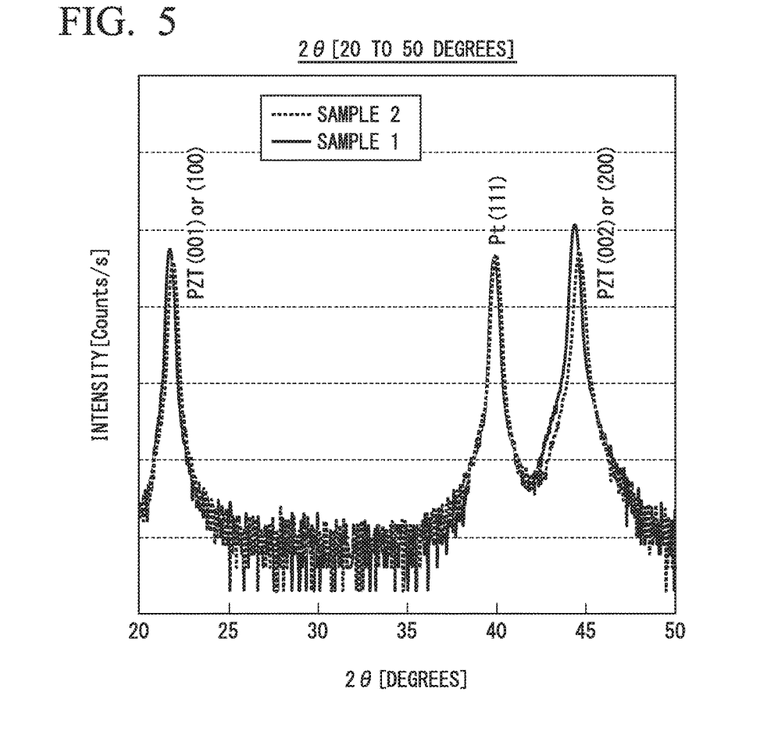
FIG. 5 is a chart showing the diffraction peaks which indicate the crystal structure of the PZT films formed by Samples 1 and 2.
Figure 6:
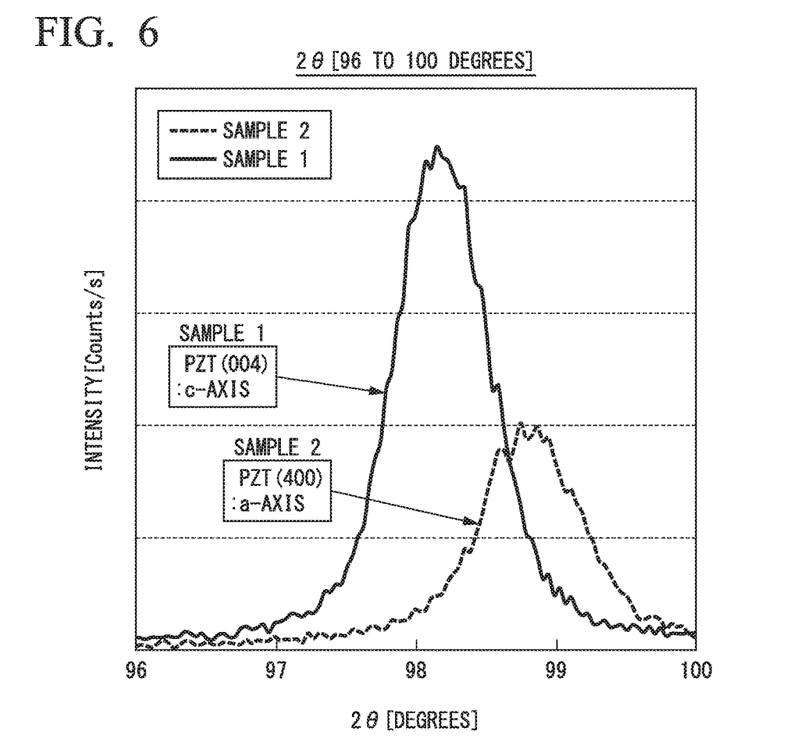
FIG. 6 is a chart showing the diffraction peaks which indicate the crystal structure of the PZT films formed by Samples 1 and 2.

FIGS. 5 and 6 show X-ray charts representing crystal structures of the PZT films of Sample 1 (a solid line) and Sample 2 (a dotted line).

FIG. 5 shows a chart in the range of 20 to 50 degrees.

FIG. 6 shows a chart in the range of 96 to 100 degrees.

It is understood from FIG. 6 that the PZT film is preferentially oriented in the a-axis (400) direction in Sample 2 in which the PZT film is formed on the Pt-substrate; on the other hand, the PZT film is preferentially oriented in the c-axis (004) direction in Sample 1 in which a $LaNiO_3$ film is formed as a seed layer and the PZT film is formed on the seed layer.

From the results described above, the PZT film is preferentially oriented in the c-axis by forming the PZT film on the seed layer formed of the $LaNiO_3$ film.

This is because the $LaNiO_3$ film has the coefficient of thermal expansion greater than that of the PZT film.

The inventors considered that, due to the magnitude relation of the coefficient of thermal expansion, the PZT film receives a compression stress in the cooling process, and the PZT film is oriented in the c-axis.

Consequently, it is determined that the dielectric layer that is preferentially oriented in the c-axis can be formed by use of a $LaNiO_3$ film as a seed layer.

Furthermore, the piezoelectricity and the fatigue characteristics of the PZT films of Samples 1 to 3 which are manufactured in the experimental examples 1 to 3, respectively, were examined The piezoelectricity was determined by use of a laser Doppler displacement gauge.

Regarding the fatigue characteristics, the cycle of 0 to+30 V, 100 kHz were repeatedly carried out, and the fatigue characteristics were evaluated based on the maximum polarization value in Hysteresis measurement.

Figure 7:
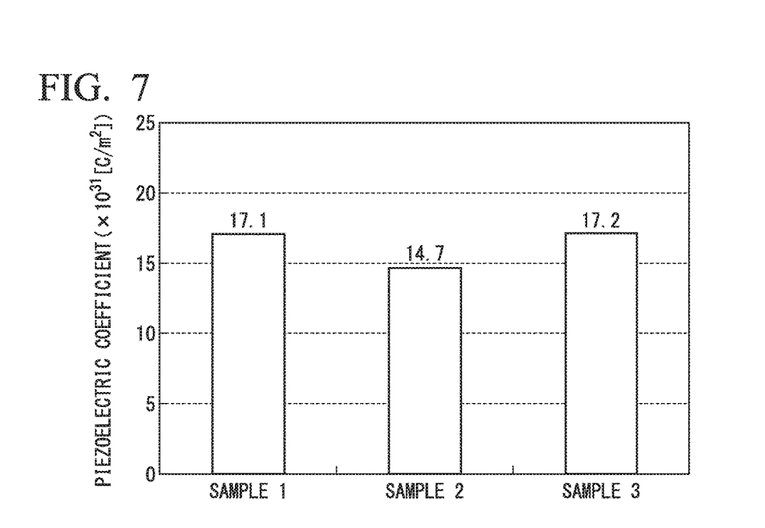
FIG. 7 is a graph showing the piezoelectricity of the PZT films of Samples 1 to 3.

FIG. 7 is a chart showing the evaluation results of the piezoelectricity (piezoelectric coefficient) of the PZT films of Samples 1 to 3 which are manufactured in the experimental examples 1 to 3, respectively.

Figure 8:
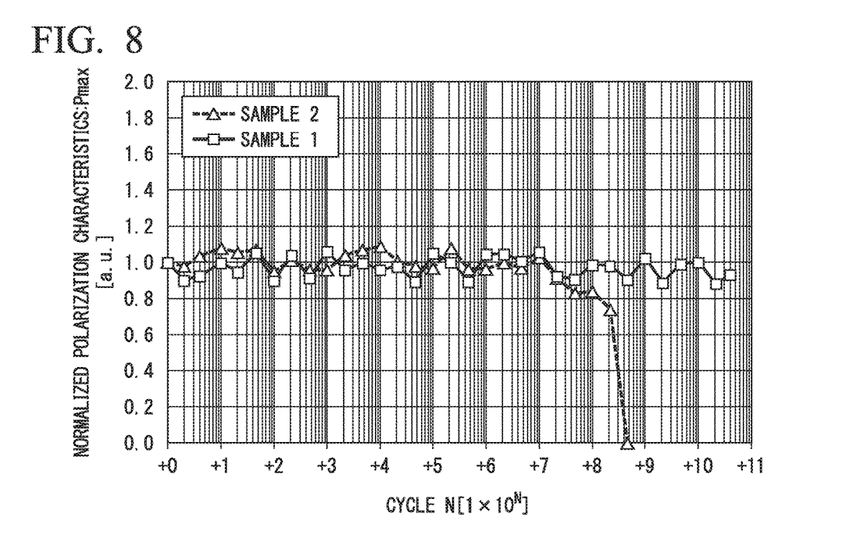
FIG. 8 is a chart showing the fatigue characteristics of the PZT films of Samples 1 and 2.

FIG. 8 is a chart showing the evaluation results of the fatigue characteristics (normalized polarization characteristics versus cycles) of the PZT films of Samples 1 and 2 which are manufactured in the experimental examples 1 and 2, respectively.

The following points were apparent from FIGS. 7 and 8.

It is understood from FIG. 7 that both Sample 1 (17.1) and Sample 3 (17.2) are substantially equally high in piezoelectric coefficient, and Sample 2 (14.7) is lower than those of the Samples.

According to FIG. 8, in Sample 2, the polarization characteristics trends to become lower from the point at which the cycles are greater than $2 \times 10^{+7}$ and becomes sharply lower at the cycles of $2 \times 10^{+8}$ or more.

Therefore, it was determined that the fatigue characteristics are $2 \times 10^{+7}$.

In contrast, in Sample 1, even where the cycles of $1 \times 10^{+11}$ or more elapse, the polarization characteristics did not become lower.

Therefore, it was understood that Sample 1 has a 1000 times longer lifetime in the fatigue characteristics than that of Sample 2.

It was apparent from the above results that, as a result of forming a PZT film on the seed layer formed of the $LaNiO_3$ film, a multi-layered film that exhibits both excellent piezoelectricity and fatigue characteristics is obtained.

Hereinbelow, in the case of changing the material used to form the film that constitutes the seed layer, the evaluation results of the piezoelectricity and the fatigue characteristics of the PZT films will be described.

In order to carry out the evaluation, three Samples 4 to 7 were manufactured which will be described later.

Experimental Example 4

In this example, a multi-layered film having a PZT film (dielectric layer) that is disposed on a seed layer formed of a $LaNiO_3$ film was formed on a substrate.

The conditions of forming the seed layer and the PZT film are the same as that of the aforementioned Sample 1.

The sample of the experimental example 4 which is manufactured under the aforementioned conditions was referred to as Sample 4.

Experimental Example 5

In this example, a multi-layered film was formed in a way similar to the case of the experimental example 1 with the exception that the seed layer is varied from the $LaNiO_3$ film to an $SrRuO_3$ film.

The conditions of forming the seed layer formed of the $SrRuO_3$ film were determined as follows.

As a target, an $SrRuO_3$ target having a diameter of 300 mm and a thickness of 5 mm was used.

A sputtering power was 0.7 (kW), a sputtering pressure was 0.4 (Pa), and a substrate temperature was 500° C. to 800° C.

The film thickness of the seed layer was 40 (nm).

The sample of the experimental example 5 which is manufactured under the aforementioned conditions was referred to as Sample 5.

Experimental Example 6

In the conditions of forming a $SrRuO_3$ film, a seed layer is formed on a substrate under conditions of a ($Ar/O_2$) ratio which causes an oxygen defect, and a PZT film (dielectric layer) is formed on the seed layer.

The other conditions of forming the seed layer and the conditions of forming the PZT film are the same as that of the aforementioned Sample 1.

The sample of the experimental example 6 which is manufactured under the aforementioned conditions was referred to as Sample 6.

Experimental Example 7

In the conditions of forming a $SrRuO_3$ film, a seed layer is formed on a substrate under oxygen-rich condition, and a PZT film (dielectric layer) is formed on the seed layer.

The other conditions of forming the seed layer and the conditions of forming the PZT film are the same as that of the aforementioned Sample 1.

The sample of the experimental example 7 which is manufactured under the aforementioned conditions was referred to as Sample 7.

The crystal structures of the PZT films of Samples 4 to 7 which are manufactured in the experimental examples 4 to 7, respectively, were analyzed by use of an X-ray diffraction method.

Figure 9:
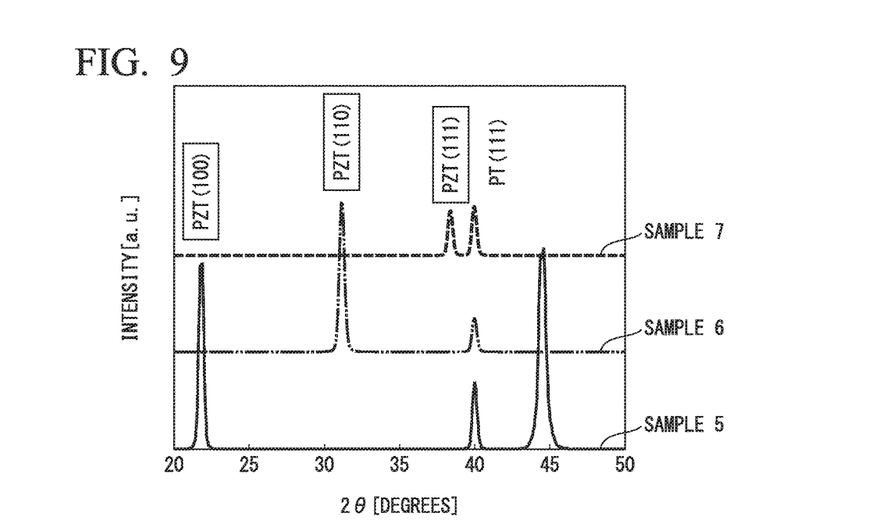
FIG. 9 is a chart showing the diffraction peaks which indicate the crystal structure of the PZT films formed by Samples 5 to 7.

FIG. 9 shows X-ray charts representing crystal structures of the PZT films of Samples 5 to 7.

In FIG. 9, the solid line, the chain double-dashed line, and the dotted line represent Sample 5, Sample 6, and Sample 7, respectively.

The following points were apparent from FIGS. 6 and 9.
(A1) In the case where an SrRuO$_3$ film is used as a seed layer, the PZT films formed thereon were preferentially oriented in the a-axis (100) direction in Sample 5, in the (110) direction in Sample 6, and in the (111) direction in Sample 7.
(A2) In contrast, only in the case where a LaNiO$_3$ film is used as a seed layer (Sample 4), the PZT films formed thereon was preferentially oriented in the c-axis.

Consequently, it was determined that the dielectric layer that is preferentially oriented in the c-axis can be formed by use of a LaNiO$_3$ film as a seed layer.

Furthermore, the piezoelectricity and the fatigue characteristics of the PZT films of Samples 4 to 7 which are manufactured in the experimental examples 4 to 7, respectively, were examined.

The piezoelectricity was determined by I-V measurement.

Regarding the fatigue characteristics, the cycle of 0 to +30 V, 100 kHz were repeatedly carried out, and the fatigue characteristics were evaluated based on the maximum polarization value in Hysteresis measurement.

Figure 10:
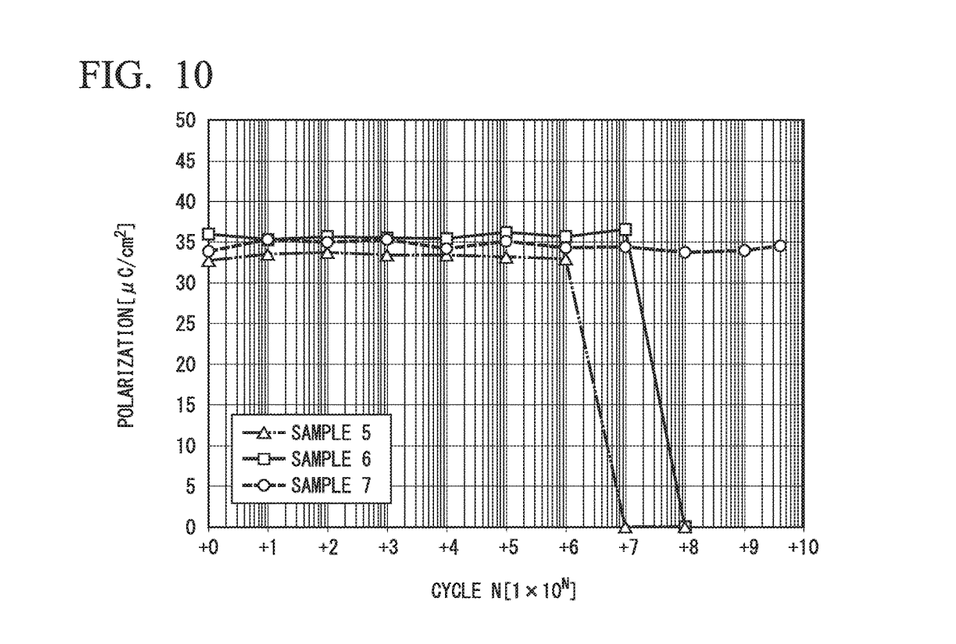
FIG. 10 is a chart showing the fatigue characteristics of the PZT films of Samples 5 to 7.

FIG. 10 is a chart showing the evaluation results of the fatigue characteristics (polarization versus cycles) of the PZT films of Samples 4 to 7 which are manufactured in the experimental examples 4 to 7, respectively.

Furthermore, Table 1 shows the piezoelectricity (piezoelectric coefficient) and the fatigue characteristics (number of cycles) of the PZT film of Samples 4 to 7.

TABLE 1

| SAMPLE | ORIENTED SURFACE OF PZT FILM | FATIGUE CHARACTERISTICS (NUMBER OF CYCLES) | PIEZOELECTRICITY (PIEZOELECTRIC COEFFICIENT) $\times 10^{31}$ [C/m$^2$] |
|---|---|---|---|
| 4 | (001) | >1 × 10$^{11}$ | −17.1 |
| 5 | (100) | 1 × 10$^6$ | −14.7 |
| 6 | (110) | 1 × 10$^7$ | −12.5 |
| 7 | (111) | >4 × 10$^9$ | −7.8 |

The following points were apparent from FIG. 10 and Table 1.
(B1) The piezoelectric coefficient of Sample 4 (17.1) was highest, and the piezoelectric coefficients of Sample 1 (14.7), Sample 2 (12.5), and Sample 3 (7.8) were lower than that of Sample 4.
(B2) The fatigue characteristics of Sample 5 (1×10$^6$ cycles) and Sample 6 (1×10$^7$ cycles) were low. Sample 7 exhibited the fatigue characteristics of 4×10$^9$ cycles or more; however, the piezoelectric coefficient thereof was low. In contrast, in Sample 4, even where the cycles of 1×10$^{11}$ or more elapse, a high degree of polarity was maintained.
(B3) In the PZT (111) oriented film (Sample 7) that does not bring 90° domain rotation, fatigue characteristics was improved; in contrast, the piezoelectricity became lower. Since Sample 4 is oriented in the c-axis and does not 90° domain, the fatigue characteristics were improved.

It was apparent from the above results that, according to the invention, a multi-layered film that exhibits both excellent piezoelectricity and extremely high voltage resistance is obtained.

Particularly, it was determined that the PZT film that is preferentially oriented in the c-axis can be formed by use of a LaNiO$_3$ film as a seed layer.

Furthermore, it was clear that the PZT film that is preferentially oriented in the c-axis exhibits both excellent fatigue characteristics and excellent piezoelectric characteristics.

Moreover, the relationship between the film formation condition and the compression stress in the case of forming a LaNiO$_3$ film by a sputtering method was evaluated.

Hereinbelow, the evaluation results will be described.

In order to carry out the evaluation, six Samples 8 to 13 were manufactured which will be described later.

Experimental Example 8

As a discharge system when sputtering is carried out, a direct current (DC) system was used, applied power was 1 kW, and a pressure was 0.4 Pa (condition 1).

The LNO film formed under the condition was Sample 8.

Experimental Example 9

As a discharge system when sputtering is carried out, a high-frequency (RF) system was used, applied power was 1 kW, and a pressure was 0.4 Pa (condition 2).

The LNO film formed under the condition 2 was Sample 9.

Experimental Example 10

As a discharge system when sputtering is carried out, a DC system was used, applied power was 0.5 kW, and a pressure was 0.4 Pa (condition 3).

The LNO film formed under the condition 3 was Sample 10.

Experimental Example 11

As a discharge system when sputtering is carried out, a DC system was used, applied power was 1.5 kW, and a pressure was 0.4 Pa (condition 4).

The LNO film formed under the condition 4 was Sample 11.

Experimental Example 12

As a discharge system when sputtering is carried out, a DC system was used, applied power was 1 kW, and a pressure was 0.2 Pa (condition 5).

The LNO film formed under the condition 5 was Sample 12.

Experimental Example 13

As a discharge system when sputtering is carried out, a DC system was used, applied power was 1 kW, and a pressure was 1.0 Pa (condition 6).

The LNO film formed under the condition was Sample 13.

The internal stresses of the LNO films of the above-mentioned Samples 8 to 18 were examined.

The internal stresses of the LNO films were measured by applying variation in curvature radius to Stoney Formula.

The results were shown in Table 2.

In Table 2, the applied power is shown as "POWER".

In the column of "INTERNAL STRESS" of Table 2, the sign "+" (positive) and the sign "−" (negative) represent "tensile stress" and "compression stress", respectively.

TABLE 2

| SAMPLE | CONDITIONS FOR FILM FORMATION | | | INTERNAL STRESS [MPa] |
|---|---|---|---|---|
| | DISCHARGE SYSTEM | POWER [kW] | PRESSURE [Pa] | |
| 8 | DC | 1 | 0.4 | −1000 |
| 9 | RF | 1 | 0.4 | −50 |
| 10 | DC | 0.5 | 0.4 | −400 |
| 11 | DC | 1.5 | 0.4 | −1500 |
| 12 | DC | 1 | 0.2 | −1300 |
| 13 | DC | 1 | 1.0 | −700 |

The following points were apparent from Table 2.

(C1) As the discharge system when sputtering is carried out, the DC is preferable more than the RF.

(C2) It is preferable that the applied power be larger.

(C3) It is preferable that, the pressure when film formation is carried out be a lower pressure.

While preferred embodiments of the invention have been described and illustrated above, the invention is not limited to the embodiments.

Various modifications may be made without departing from the scope of the invention.

Industrial Applicability

The invention is widely applicable to a multi-layered film.

DESCRIPTION OF REFERENCE NUMERAL 1 multi-layered film
2 substrate
3 electroconductive layer
4 seed layer
5 dielectric layer
10 film formation apparatus
11 vacuum chamber
13 sputtering power source
14 sputtering gas introduction unit
18 temperature controller
21 target
31 substrate
32 support
34 adhesion-preventing plate (first adhesion-preventing plate)

What is claimed is:

1. A multi-layered film comprising an electroconductive layer made of platinum (Pt), a seed layer including lanthanum (La), nickel (Ni), and oxygen (O), and a dielectric layer being oriented in a c-axis direction, which are at least sequentially disposed on a main surface of a substrate made of silicon;
   wherein an internal stress of the seed layer is a compression stress in a range of 50 Mpa to 1500 Mpa.

2. The multi-layered film according to claim 1, wherein the dielectric layer includes lead (Pb), zirconia (Zr), titanium (Ti), and oxygen (O).

3. The multi-layered film according to claim 1, wherein the dielectric layer is made of Pb $(Zr_xTi_{1-x})O_3$, and $0.2 \leq x \leq 0.52$.

4. The multi-layered film according to claim 1, wherein a thickness of the dielectric layer is 0.1 to 5 μm.

5. A method of manufacturing a multi-layered film, comprising:
   forming an electroconductive layer;
   forming a seed layer so as to coat the electroconductive layer so that an internal stress of the seed layer is a compression stress in a range of 50 MPa to 1500 MPa;
   forming a dielectric layer so as to coat the seed layer; and
   controlling a temperature so as to apply a compression stress to the dielectric layer in a cooling process after the dielectric layer is formed; and
   wherein the electroconductive layer is made of platinum (Pt), the seed layer includes lanthanum (La), nickel (Ni), and oxygen (0), and the dielectric layer is oriented in a c-axis direction, which are at least sequentially disposed on a main surface of a substrate made of silicon.

* * * * *